United States Patent [19]

Shiba et al.

[11] Patent Number: 4,760,359

[45] Date of Patent: Jul. 26, 1988

[54] SURFACE ACOUSTIC WAVE RESONATOR

[75] Inventors: Takashi Shiba, Yokosuka; Norio Hosaka, Yokohama; Takemitsu Buma, Yokohama; Jun Yamada, Yokohama, all of Japan

[73] Assignee: Hitachi, Ltd., Tokyo, Japan

[21] Appl. No.: 763

[22] Filed: Jan. 6, 1987

[30] Foreign Application Priority Data

Jan. 10, 1986 [JP] Japan ................................. 61-2037

[51] Int. Cl.$^4$ .............................................. H03H 9/25
[52] U.S. Cl. .................................... 333/194; 333/195; 310/313 B; 310/313 D
[58] Field of Search ......................... 333/150, 151–155, 333/193–196; 310/313 R, 313 A, 313 B, 313 C, 313 D

[56] References Cited

U.S. PATENT DOCUMENTS

| | | | |
|---|---|---|---|
| 4,249,146 | 2/1981 | Yen et al. | 333/196 X |
| 4,281,301 | 7/1981 | Stevens et al. | 333/151 X |
| 4,325,037 | 4/1982 | Bulst et al. | 333/194 |

Primary Examiner—Eugene R. Laroche
Assistant Examiner—Seung Ham
Attorney, Agent, or Firm—Antonelli, Terry & Wands

[57] ABSTRACT

A surface acoustic wave resonator has two solid-type interdigital transducers and two grating reflectors arranged on a piezoelectric substrate or on a surface acoustic wave substrate which contains a piezoelectric material and the reflectors are arranged outside these transducers. If the electrode pitch of the interdigital transducers is suitably different from the pitch of grating of the reflectors, ripples caused by the triple transit echo at frequencies other than the peak frequency are deviated so as to lie outside the stop band of the reflectors, so that spurious responses are suppressed. In this case, the number of electrode pairs Ni of the interdigital transducers should satisfy a relation, $Ni \geq \pi/\epsilon$, wherein $\epsilon$ denotes a characteristic mechanical impedance mismatch contribution on the surface of the electrode and on the free surface in the interdigital transducers, so that a peak caused by the trapping of energy in the interdigital transducers is brought into agreement with a peak caused by the triple transit echo to decrease the losses and to increase the Q value.

2 Claims, 5 Drawing Sheets

SURFACE ACOUSTIC WAVE RESONATOR

BACKGROUND OF THE INVENTION

The present invention relates to a surface acoustic wave resonator which features small losses, high Q values and high spurious suppression.

A surface acoustic wave resonator having small losses and high Q values can be realized by employing an interdigital transducer (IDT) with many electrodes as disclosed in "Koyamada et al.; 'Analysis of SAW Resonators Using Long IDT's and Their Applications', The Transactions of the Institute of Electronics and Communication Engineers of Japan, Vol. 60 - A No. 9, September, 1977". Though this method is effective to reduce the loss and to increase the Q value, no consideration has been given in regard to decreasing spurious responses as will be described below.

SUMMARY OF THE INVENTION

The object of the present invention is to provide a surface acoustic wave resonator employing an IDT with many electrodes, which features small losses, high Q value and small spurious response, to preclude the aforementioned problem of large spurious response inherent in the conventional art.

The surface acoustic wave resonator of the present invention has two solid-type interdigital transducers and two grating reflectors arranged on a piezoelectric substrate or on a surface acoustic wave substrate which contains a piezoelectric material, and the grating reflectors are arranged on the outside of these transducers. In order to achieve the above object, the present invention calls for a surface acoustic wave resonator wherein the number of electrode pairs Ni of the interdigital transducers satisfies a relation $$N_i \geq \pi/\epsilon$$

wherein $\epsilon$ denotes a characteristic mechanical impedance mismatch contribution on the surface of the electrode and on the free surface in the interdigital transducers, and wherein the electrode pitch of the interdigital transducers and the pitch of the grating of the reflectors differ from each other to such an extent that ripples caused by triple transit echo at frequencies other than the peak frequency are deviated to lie outside the stop band of the reflectors.

DESCRIPTION OF THE PREFERRED EMBODIMENTS

Figure 1:
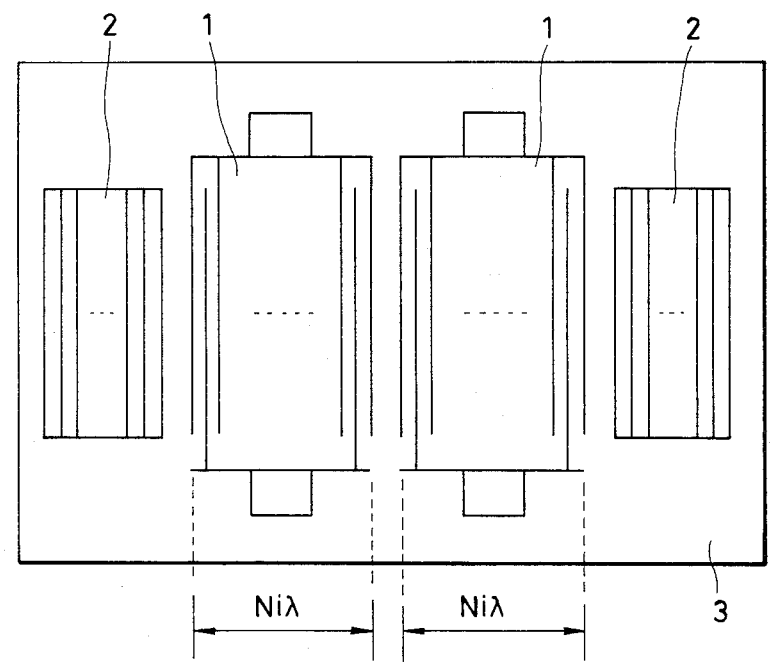
FIG. 1 is a schematic plan view of a surface acoustic wave element according to the present invention.

The present invention employs IDT's with many electrodes to reduce the losses and to increase the Q value. According to the conventional art employing a resonator of the IDT type with many electrodes, nothing has been specified in regard to selecting the number of electrodes.

In the solid-type IDT, the surface wave energy is trapped in the interdigital transducer, producing a peak on the low-frequency side or on the high-frequency side of a pass band that is determined by the interdigital transducer. The loss is reduced and a high Q value is accomplished by bringing the ripples caused by triple transit echo into agreement with the peak. As known, if the number of electrode pairs of the interdigital transducer is denoted by Ni, the band width $\Delta f_i$ of the rejection level is normalized by a center frequency $f_{oi}$ determined by the electrode pitch, as given by, $$\frac{\Delta f_i}{f_{oi}} = \frac{2}{N_i} \quad (1)$$

Since the interdigital transducer can also be regarded to be a reflector, its stop band Bi can be calculated by using a characteristic mechanical impedance mismatch contribution $\epsilon$ of a portion where the electrode exists and that of a free surface, in accordance with the following equations, $$\frac{B_i}{f_{oi}} = \frac{2}{\pi} \sqrt{\Delta^2 + \epsilon^2 \sin^2(\pi t)} \quad (2)$$

$$\Delta = \epsilon \sin(\pi t) \sin(2N_i \Delta) \quad (3)$$

where t denotes a metallization ratio (electrode width/pitch).

The above equations are borrowed from a reference by P. S. Cross et. al., IEEE, Trans. SU-23, No. 4, 1976. When the number of electrode pairs Ni is sufficiently great, the equation (2) can be written as, $$\frac{B_i}{f_{oi}} \approx \frac{2}{\pi} \epsilon \quad (4)$$

It is the requirement of the resonator of the IDT type with many electrodes to bring the peak of the interdigital transducer into strict agreement with the peak of the triple transit echo. Therefore, the stop band given by the equation (2) must be greater than the band width of the equation (1). From the equations (1) and (4), the number of electrode pairs Ni is given by, $$N_i \geq \frac{\pi}{\epsilon} \quad (5)$$

The number of pairs of IDT with many electrodes is specified in compliance with the equation (5). If the resonator is constituted in a customary manner with this number of electrode pairs, the spurious response appears conspicuously as mentioned already. In order to solve this problem, the inventor has forwarded the study and has discovered the fact that the conspicuous spurious response can be suppressed if the center frequency of the interdigital transducer is made suitably different from the center frequency of the reflector.

As described above, the center frequency of the interdigital transducer is made to differ from the center frequency of the reflector. That is, if the electrode pitch of the interdigital transducer is made different from the pitch of the grating of the reflector, the ripples caused by triple transit echo other than the peak frequency can be deviated to lie outside the stop band of the reflector, so that the spurious response can be suppressed. To what extent the pitch should be made to differ is determined by repeating the calculations or experiments so that the ripples are effectively suppressed.

The invention will now be described in further detail in conjunction with FIGS. 1 to 9. FIG. 1 is a plan view which schematically illustrates a surface acoustic wave resonator of the IDT type with many electrodes according to the present invention. Interdigital transducers 1 and the reflectors 2 are arranged on a surface acoustic wave substrate 3 in a manner as shown in FIG. 1. If the electrode pitch is denoted by $\lambda/2$, the width of the interdigital transducer is given by the product of an electrode pair number Ni and $\lambda$. If the effective speed of sound V is determined, $\lambda$ established the following relation with respect to a center frequency $f_{oi}$ of the interdigital transducer, $$V = f_{oi} \lambda \quad (6)$$

FIG. 1 illustrates in an exaggerated manner the difference between the electrode pitch of the interdigital transducer and the pitch of grating of the reflector.

According to this embodiment, an experimental resonator was prepared by using an ST-X crystal substrate, selecting the peak frequency to be 668 MHz, and selecting the thickness of electrode film to be 1000 angstroms. If the characteristic impedance of a portion where the electrode exists is denoted by $z_m$ and the characteristic impedance of a free surface is denoted by $z_o$, the characteristic mechanical impedance mismatch contribution $\epsilon$ is given by, $$\epsilon = \frac{z_m}{z_o} - 1 \quad (7)$$

Figure 2:
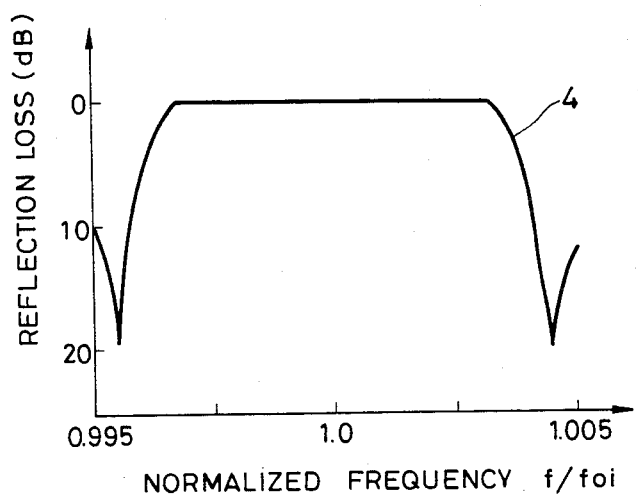
FIG. 2 is a diagram showing reflection characteristics of an interdigital transducer.
Figure 3:
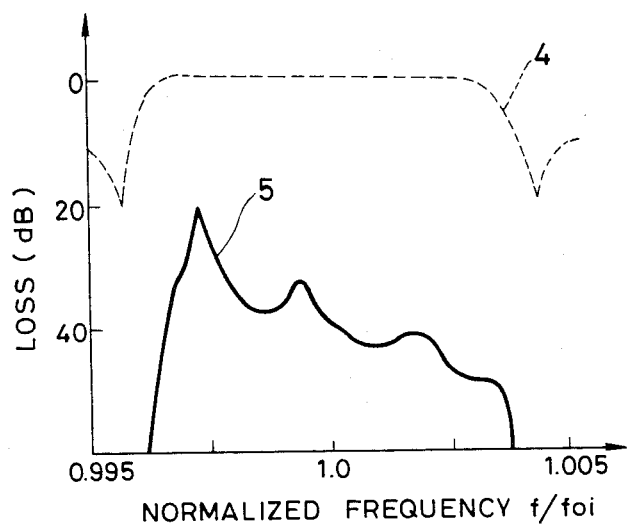
FIG. 3 is a diagram showing transmission characteristics of only when the interdigital transducers are employed.

Experiments indicated $\epsilon$ to be 0.012. In accordance with the equation (5), therefore, the number of electrode pairs Ni was determined to be 300 pairs. FIG. 2 shows a stop band of the interdigital transducer, wherein a solid line 4 represents reflection characteristics of the interdigital transducer. FIG. 3 shows characteristics of the interdigital transducer, wherein a solid line 5 represents transmission loss of the interdigital transducer when no reflector is used. The peak caused by the trapping of energy in the transducer is in agreement with the peak caused by the triple transit echo.

REFERENCE EXAMPLE

Figure 4:
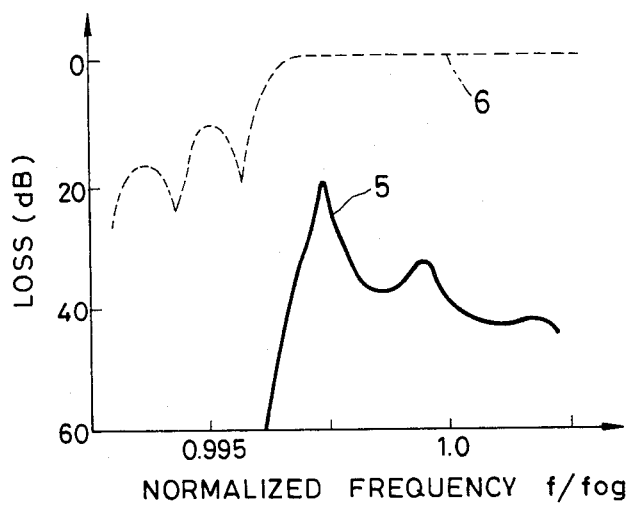
FIG. 4 is a diagram showing a stop band of a reflector of a conventional resonator and transmission characteristics of the interdigital transducer.
Figure 5:
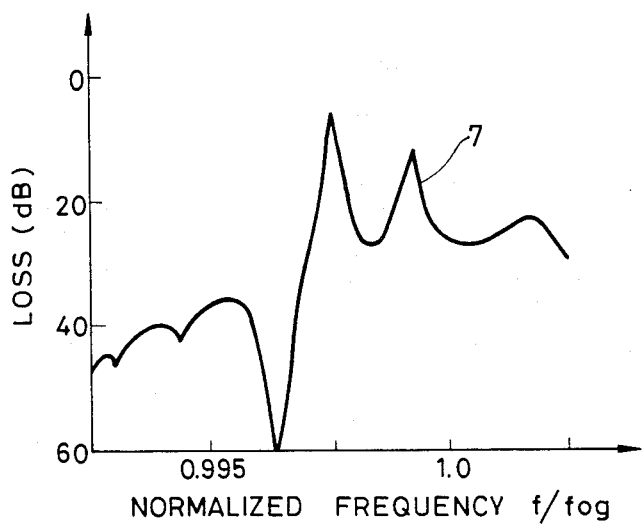
FIG. 5 is a diagram showing characteristics of a conventional resonator.

For the purpose of comparison, the inventors have designed a resonator in a conventional manner. FIG. 4 shows reflection characteristics (broken line 6) of the reflector in a conventional resonator and transmission loss (solid line 5) of the interdigital transducer alone. In FIG. 4, $f_{og}$ denotes a center frequency determined by the pitch of the grating of the reflector. In this conventional device, the electrode pitch of the interdigital transducer is equal to the pitch of the grating of the reflector, and the center frequencies of the two are equal to each other. FIG. 5 shows characteristics of a resonator to which an oscillator is attached, wherein a solid line 7 denotes transmission losses. Though the loss is 6 dB and the loaded Q is 3500, it is recognized that spurious responses develop in a large number.

Embodiment 1

Figure 6:
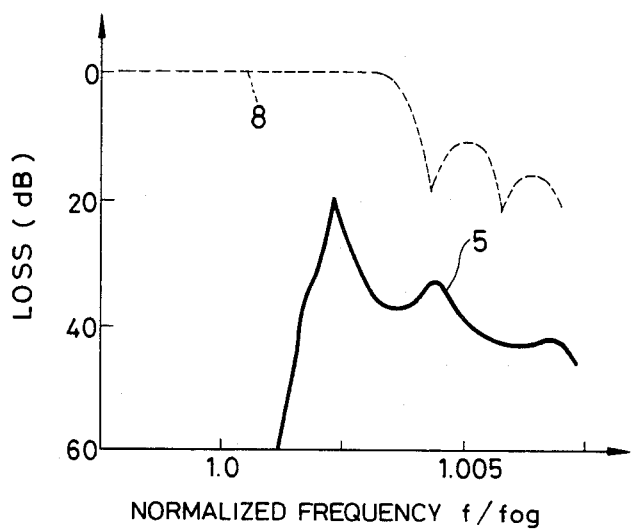
FIG. 6 is diagram showing a stop band and characteristics of the interdigital transducer according to an embodiment of the present invention.
Figure 7:
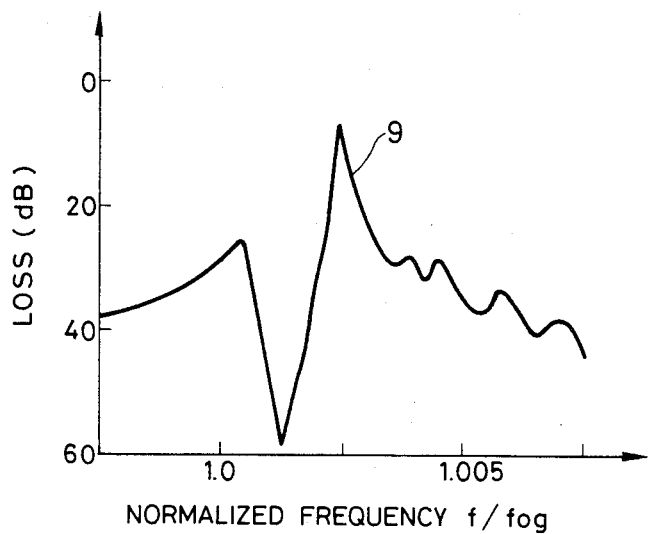
FIG. 7 is a diagram showing characteristics of a resonator according to an embodiment of the present invention.

FIG. 6 shows reflection characteristics (broken line 8) of a reflector and characteristics (solid line 5) of the interdigital transducer alone, in the present embodiment. The electrode pitch of the reflector was set to be 1.005 times as great as that of the interdigital transducer ($f_{og} > f_{oi}$), so that ripples caused by the triple transit echo other than the peak frequency lie outside the stop band. FIG. 7 illustrates characteristics of the obtained resonator, wherein a solid line 9 represents transmission losses. The loss was 6.2 dB, the loaded Q was 3500, and spurious response could be suppressed by more than 15 dB.

Embodiment 2

Figure 8:
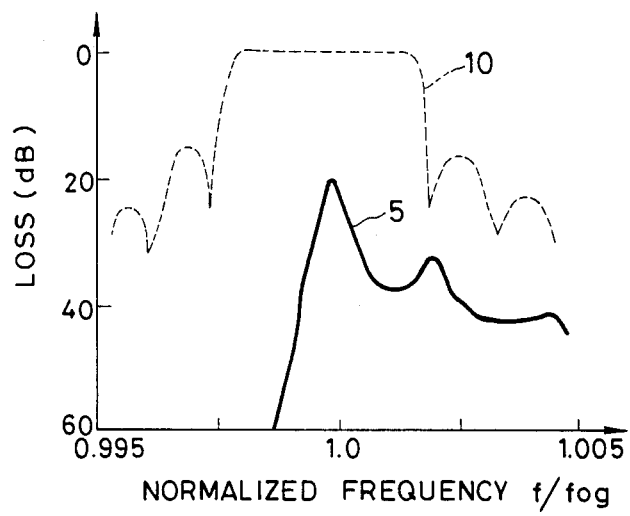
FIG. 8 is a diagram showing a stop band and characteristics of the interdigital transducer according to another embodiment of the present invention.
Figure 9:
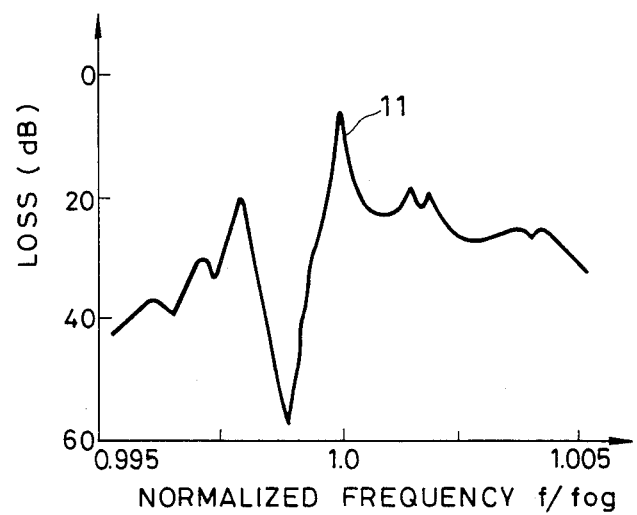
FIG. 9 is a diagram showing characteristics of a resonator according to another embodiment of the present invention.

FIGS. 8 and 9 illustrate characteristics of the present embodiment when the pitch of the reflector is set to be 1.0025 times as great as the pitch of the interdigital transducer, and the metallization ratio of the reflector is set to be 30%. FIG. 8 shows reflection characteristics (broken line 10) of this case and characteristics (solid line 5) of the interdigital transducer alone. FIG. 9 shows characteristics of the obtained resonator, wherein a solid line 11 represents transmission losses. There was obtained such a good result that the loss was 7 dB, the loaded Q was 3600, and spurious response could be suppressed by more than 16 dB. The feature of this embodiment resides in the fact that dispersion in the peak frequency caused by the dispersion in the metallization ratio, which inevitably develops during the steps of fabrication due to small absolute values of size, varies little, since the peak frequency exists at the center of the stop band of the reflector.

As described above, the present invention makes it possible to obtain a surface acoustic wave resonator which features small losses, high Q values and reduced spurious response (improved by more than 5 dB compared with the conventional devices), by employing interdigital transducers with many electrodes.

What is claimed is:

1. In a surface acoustic wave resonator comprising two solid-type interdigital transducers having a number of electrode pairs and two grating reflectors arranged on a piezoelectric substrate or on a surface acoustic wave substrate which contains a piezoelectric material, the grating reflectors being arranged on the outside of said transducers, the improvement comprising providing the interdigital transducers with a number of electrode pairs Ni which satisfies the relation $$Ni \geq \frac{\pi}{\epsilon}$$

wherein $\epsilon$ denotes a characteristic mechanical impedance mismatch contribution on the surface of the electrode and on the free surface in the interdigital transducers, and wherein the electrode pitch of the interdigital transducers and the pitch of the grating of the grating reflectors are made to differ from each other to such an extent that ripples caused by a triple transit echo at frequencies other than the peak frequency are deviated so as to lie outside the stop band of the reflectors.

2. A surface acoustic wave resonator according to claim 1, wherein said electrode pitch of the interdigital transducers and said pitch of the grating of the reflectors are different from each other so that said peak frequency lies nearly at the center of the stop band of said reflectors.

* * * * *